United States Patent
Wyse et al.

(10) Patent No.: US 9,444,418 B1
(45) Date of Patent: Sep. 13, 2016

(54) FREQUENCY ENHANCED ACTIVE TRANSISTOR

(71) Applicants: Russell D. Wyse, Center Point, IA (US); Michael L. Hageman, Mt. Vernon, IA (US)

(72) Inventors: Russell D. Wyse, Center Point, IA (US); Michael L. Hageman, Mt. Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 41 days.

(21) Appl. No.: 14/206,632

(22) Filed: Mar. 12, 2014

Related U.S. Application Data

(60) Provisional application No. 61/789,902, filed on Mar. 15, 2013.

(51) Int. Cl.
   *H03F 3/45*     (2006.01)
   *H03F 3/19*     (2006.01)
   *H03G 3/00*     (2006.01)

(52) U.S. Cl.
   CPC .............. *H03F 3/4508* (2013.01); *H03F 3/19* (2013.01); *H03G 3/00* (2013.01)

(58) Field of Classification Search
   CPC .................................................. H03F 3/45076
   USPC ........................................ 330/252, 254, 288
   See application file for complete search history.

(56) References Cited

U.S. PATENT DOCUMENTS

| | | | | |
|---|---|---|---|---|
| 4,236,119 A | * | 11/1980 | Battjes | ...................... H03F 1/42 330/288 |
| 5,399,988 A | | 3/1995 | Knierim | |

* cited by examiner

*Primary Examiner* — Khanh V Nguyen
*Assistant Examiner* — Khiem Nguyen
(74) *Attorney, Agent, or Firm* — Donna P. Suchy; Angel N. Gerdzhikov

(57) ABSTRACT

A transistor cell can be modeled as a transistor with a collector, a base, and an emitter operating with a current at the collector to produce a minimum transconductance in the transistor cell that increases a current gain and improves at least one operating characteristic of the transistor cell. The operating characteristics include bandwidth, gain, and output power.

11 Claims, 7 Drawing Sheets

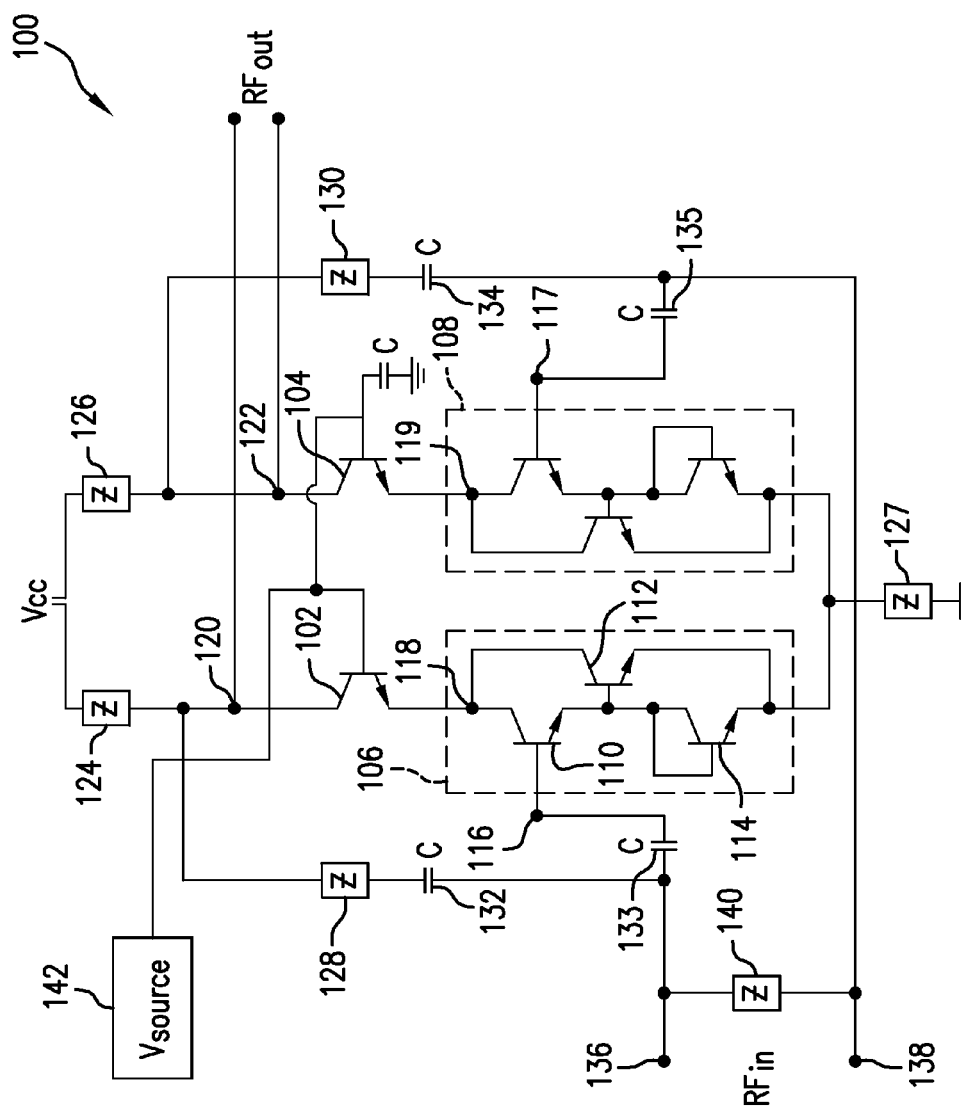
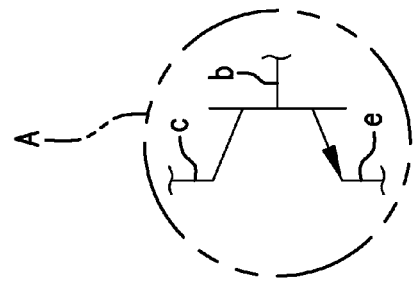
FIG. 1B
FIG. 1C

FREQUENCY ENHANCED ACTIVE TRANSISTOR

This application claims priority to U.S. Provisional Patent Application No. 61/789,902 filed Mar. 15, 2013, which is hereby incorporated herein by reference.

This applicant incorporates by reference U.S. patent application Ser. No. 13/714,209 filed Dec. 13, 2012 "ULTRA-PRECISION LINEAR PHASE SHIFTER WITH GAIN CONTROL"; and U.S. patent application Ser. No. 13/737,777 filed Jan. 9, 2013 "HIGH-DYNAMIC RANGE PRECISION VARIABLE AMPLITUDE CONTROLLER". The entirety of both applications are incorporated by reference herein.

BACKGROUND OF THE INVENTION

This invention relates to radio communications, and more specifically to radio frequency (RF) amplification in RF equipment.

Radio frequency (RF) communications equipment generally employs a combination of mixers and amplifiers. Amplifiers are useful to increase the power level of a signal of interest. In RF transmission, RF mixers are used to transpose radio frequencies to a useful signal for transmission and delivery at an intermediate frequency. Conversely, in reception, mixers are used to transpose the RF frequency of a received signal to a relatively low intermediate frequency for processing by downstream electronic circuits.

SUMMARY

According to an embodiment of the present disclosure, there is provided a frequency-enhanced transistor super cell (referred to hereinafter as a "transistor cell") that can be modeled as a transistor with a collector, a base, and an emitter. The transistor cell operates with a current at the collector that produces a minimum transconductance in each transistor in the transistor cell to increase a current gain of the transistor cell and improve at least one operating characteristic of the transistor cell as compared to a single transistor. The operating characteristics include bandwidth, gain, and output power. More specifically, the transistor cell comprises a first transistor, a second transistor, and a third transistor, wherein each transistor has an emitter, a base, and a collector. The collector of the first transistor is connected to the collector of the second transistor and the emitter of the first transistor is connected to the base of the second transistor. The collector of the third transistor is connected to the base of the second transistor, the base of the third transistor is connected to the base of the second transistor, and the emitter of the second transistor is connected to the emitter of the third transistor.

In another embodiment, the transistor cell can be combined in cascode with a second transistor cell to provide an RF circuit suitable for use in an RF transceiver. In this arrangement, the emitter of the first transistor cell is connected to the collector of the second transistor cell. An input port to the RF circuit is connected to the base of the second transistor cell and an output port of the RF circuit is connected to one chosen from the collector of the first transistor cell and the emitter of the first transistor cell. The input port receives an input signal and the output port provides an output signal.

In a further embodiment, multiple transistor cells can be arranged as a mixer. A first transistor cell pair and a second transistor cell pair are electrically connected to a first input port, a second input port, and an intermediate frequency output port. The first input port is adapted for receiving an RF signal. The second input port is connected to the respective bases of the first transistor cell pair and the second transistor cell pair and adapted for receiving a local oscillator (LO) signal. The intermediate frequency output port is adapted for providing a mixed signal from the first and the second transistor cell pairs. Each transistor cell in the first transistor cell pair and the second transistor cell pair has a collector, a base, and an emitter. The base of each transistor cell in the first transistor cell pair is connected and the base of each transistor cell in the second transistor cell pair is connected. The first input port is connected to the emitters of the first transistor cell pair and the second transistor cell pair.

An amplification stage can also be connected between the first input port and the emitters of the first transistor cell pair and the second transistor cell pair. The amplification stage can include two transistor cells, wherein each of the two transistor cells has an emitter connected to a common port, a collector connected to the first input port, and a base adapted for receiving the RF signal.

In yet another embodiment, the transistor cell can be arranged in a transistor cell core with four transistor cells. The transistor cell core is connected to two first input ports for receiving a differential input signal and two output ports for providing a differential output signal. The four transistor cells are cross-connected to form two transistor cell pairs to provide a differential gain to the differential input signal. Each of the transistor cells in the transistor cell pair has an emitter connected to each other, a base connected to one of the two first input ports, and a collector connected to one of the two output ports.

An additional transistor cell can be connected to the emitter of each one of the two transistor cell pairs in the transistor cell core. The differential input signal can be a local oscillator signal, and the additional transistor cell connected to the emitter of each one of the two transistor cell pairs in the transistor cell core can include a base connected to one of two second input ports for receiving a second differential input signal.

In another embodiment, the transistor cell core is an amplifier with a load connected to the amplifier. The load can include a transistor cell connected to each of the two output ports of the transistor cell core to increase a frequency range of the amplifier and adjust a transconductance of the four transistor cells in the transistor cell core.

In a further embodiment, a transistor cell can be connected to each one of the transistor cell pairs to provide two stage amplification of the differential input signal. In this embodiment, the transistor cell core is an amplifier with a load connected to the amplifier. The load can further include a transistor cell connected to each of the two output ports and the amplifier to increase a frequency range of the amplifier.

These and other aspects, features, and advantages of the invention will become apparent upon review of the following description taken in connection with the accompanying drawings. The invention, though, is pointed out with particularity by the appended claims.

DESCRIPTION OF THE PREFERRED EMBODIMENTS

Figure 1A:
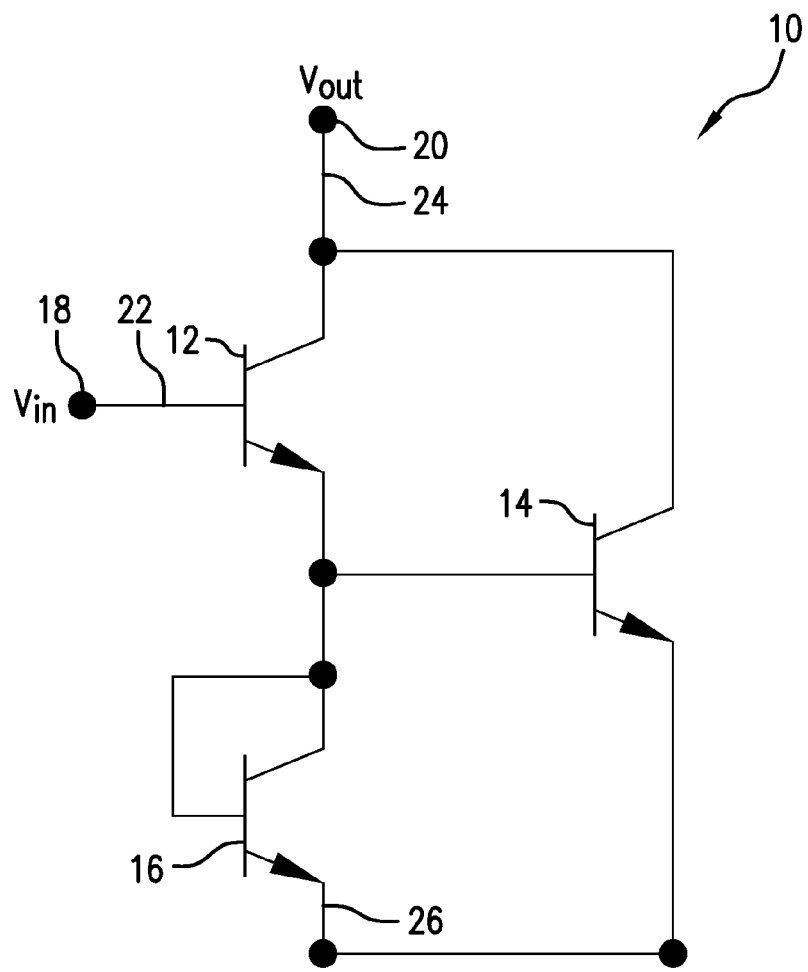
FIG. 1A is a schematic diagram of a transistor cell.

The transistor unity-gain frequency or frequency transition (Ft) is the frequency where the short circuit current gain of a common-emitter transistor falls to unity. A frequency-enhanced transistor super cell 10 (referred to hereinafter as a "transistor cell 10"), shown in FIG. 1A, is a circuit, which can be modeled as a transistor, that nearly doubles the Ft of a transistor technology. Transistor cell 10 includes a transistor 12 and a transistor 14 that are Darlington-connected, and between a base and an emitter of transistor 14, a diode-connected transistor 16 is connected in parallel. The base of transistor 12 is an input port 18 and the collectors of transistors 12 and 14 become an output port 20 of transistor cell 10.

FIG. 1C shows a typical transistor used in transistor cell 10 with a collector "c", a base "b", and an emitter "e". The transistors employed in transistor cell 10 are bipolar transistors, such as bipolar junction transistor (BJT) or heterojunction bipolar transistor (HBT) constructed with various fabrication technologies, including on a semiconductor substrate, such as silicon (SI) substrate, silicon-germanium (Si—Ge), gallium-arsenide (GaAs) substrate, indium gallium phosphide (InGaP), or gallium-nitride (GaN). Other types of transistors can be used as well.

Since transistor cell can be modeled as a transistor, transistor cell has a base 22, a collector 24, and an emitter 26, but with two base-emitter junctions between transistors 12 and 16. The input voltage at input port 18 is divided across the base-emitter junctions of each transistor 12 and 16. The transconductance (Gm) is also proportional to the current at collector 24 ($I_c$) of transistor cell 10 by the ratio of: $Gm=I_c/V_t$, where $V_t$ is the thermal voltage of the transistor topology, which is typically about 26 mV at room temperature for an HBT. The transconductance decreases in value as $I_c$ decreases below the value for the thermal voltage, i.e. where the ratio of $I_c/V_t$ is less than one. As $I_c$ continues to decrease, the transistor cell will reach a critically low transconductance before a single transistor of the same topology; however, as the current at collector 24 ($I_c$) of transistor cell 10 increases above the value for the thermal voltage ($V_t$), i.e. where the ratio of $I_c/V_t$ is greater than 1, the transconductance (Gm) increases.

Figure 6A:
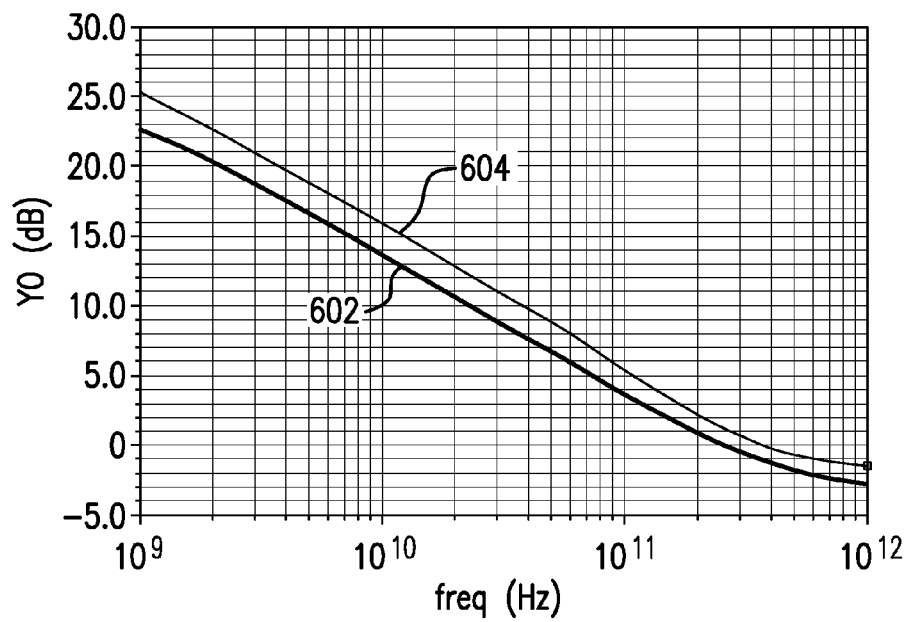
FIG. 6A is a graph comparing the current gain of a single SiGe HBT transistor to the transistor cell of FIG. 1A comprising SiGe HBT transistors.
Figure 6B:
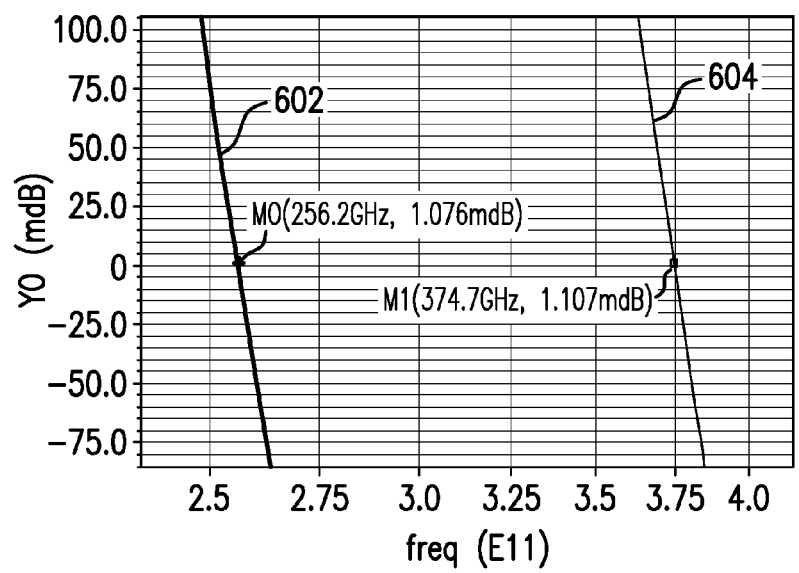
FIG. 6B is a close up view of where the current gain plots of FIG. 6A pass the unity gain threshold.

Current gain (β) in transistor cell 10 is also much better compared to a single transistor of the same topology. Current gain (β) is the ratio of the current at collector 24 of transistor cell 10 and the current at base 22 of transistor cell 10. FIGS. 6A and 6B illustrate the increased frequency handling capabilities of transistor cell 10 over a typical transistor. Both Transistor cell 10 and the typical transistor incorporate SiGe HBT technology biased at 50 mA with an AC short circuit to test current gain (β) from base 22 to collector 24 of transistor cell 10, and sized to maximize the Ft of each transistor 12, 14, and 16.

FIG. 6A compares current gain beta (β) in decibels (y-axis) to frequency in Hertz (x-axis). Line 602 in FIG. 6A shows how the current gain beta (β) of a typical transistor decreases as the frequency of the input signal at input port 18 increases. Line 604 in FIG. 6A shows how the current gain beta (β) of transistor cell 10 decreases as the frequency of the input signal at input port 18 increases. A comparison of line 602 to 604 shows that transistor cell 10 has greater current gain capabilities over a larger range of frequencies.

FIG. 6B more clearly shows how dramatic the performance increase of transistor cell 10 is compared to the typical transistor. FIG. 6B is a close-up view of a portion of FIG. 6A at the unity gain frequency (i.e. where the gain equals 1 or gain in dB equals 0). The unity gain frequency of the type of transistor used in transistor cell 10 (i.e. transistor 12, 14, or 16), is about 256.2 GHz. The unity gain frequency of transistors 12, 14, and 16 arranged as transistor cell 10 is 374.7 GHz, which amounts to a forty-six percent increase in performance over any one of Transistors 12, 14, or 16 that are used in transistor cell 10.

Transistor cell 10 operating with a collector current greater than 26 mA and a transconductance greater than 1 can yield a circuit with improved operating performance. The minimum transconductance causes a squaring effect of a current gain to improve the at least one operating characteristic of transistor cell 10. transistor cell 10 also has benefits while operating with a collector current less than 26 mA and a transconductance less than 1 due to its high input impedance (Z), which minimizes loading when it is connected to other circuits, yet maintains the advantage of an improved current gain beta (β) and higher Ft. In other words, transistor cell 10 tends to maintain its operational characteristics regardless of how it is combined with other circuits. Measurements have shown that transistor cell 10 has more than a 10-fold increase in input impedance over a typical transistor of the same technology, due in part to the much higher effective current gain (β). This means that even though a collector current less than 26 mA decreases the transconductance of transistor cell, there is a threshold where the negative effects of a low transconductance are outweighed by the benefits of the high input impedance. This occurs where a current at the collector of the transistor cell produces a minimum transconductance in the transistor cell that increases a current gain and improves one or more operating characteristics of the transistor cell. This minimum transconductance in some circuit topologies is about 0.77 Siemens, which corresponds to about 20 mA current at the collector, assuming a thermal voltage of 26 mV; however, there could be other circuit topologies where similar advantages can be found with less current. Thus, based on the assumed thermal voltage, it is preferable to operate transistor cell 10 with at least 20 mA of current at the collector. Above this value, transistor cell 10 tends to produce improvements in operating characteristics, such as bandwidth, gain, and output power Transistor cell 10 when operated as described herein is useful in many applications. It has been shown to produce digital logic gates with incredibly fast switching capabilities. It is also shown to have considerable benefits in analog circuits whenever high gain, bandwidth, or output power is required. Transistor cell 10 is particularly useful when biased forward active and operated in an active region. The tradeoff for the above advantages is that transistor cell 10 has three transistors 12, 14, and 16, which each must be driven by a sufficient overhead voltage from an external voltage source. This means that transistor cell 10 is primarily useful where higher power consumption is tolerable.

FIG. 1B shows a schematic of a differential amplifier 100 incorporating a pair of transistor cells 102 and 104, which are modeled as transistor super-cells as discussed above. Each transistor cell 102 and 104 forms a cascode with one of two transistor cells 106 and 108.

Cascode coupling refers to two-stage amplification that extends the available bandwidth of the overall amplification stage. The first amplification stage of the cascode-coupling, the input stage, includes a transistor cell with its emitter connected to a common port. The common-emitter stage has high input impedance and low voltage gain because its collector output drives into the low impedance of the emitter of the transistor cell in the second stage. The second amplification stage, the output stage, includes a transistor cell with its base connected to the common port. The common-base stage provides low input impedance for the common-emitter stage, which reduces its voltage gain and Miller Capacitance effect to extend the overall gain and bandwidth of the amplifier. Cascode-coupling of two amplification stages advantageously provides a wide bandwidth, high gain, and high input impedance.

Figure 2:
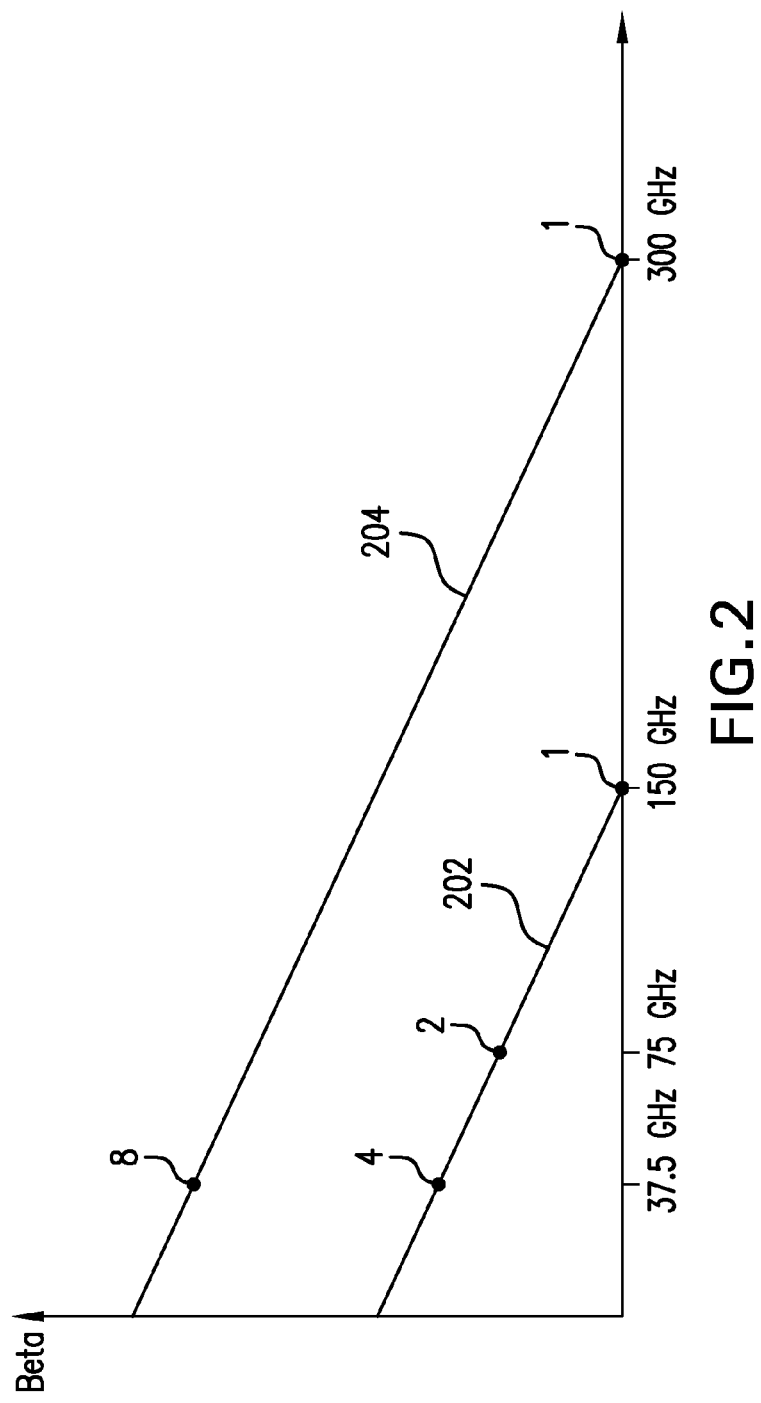
FIG. 2 is an AC short circuit current gain graph comparing the response of a bipolar junction transistor with the response of the transistor cell bipolar transistor unit cells of FIG. 1B.

FIG. 2 shows an estimation of the current-gain beta ($\beta$) versus frequency response (line 202) of a commercially available 150 GHz process SiGe HBT, and the beta versus frequency response (line 204) of the same HBT transistors configured as a transistor cell. Line 202 shows the frequency of the unity current gain (i.e., $\beta=1$) is at 150 GHz while $\beta=4$ is at 37.5 GHz. Line 204 shows the frequency of the unity current gain is at 300 GHz while a $\beta=8$ is at 37.5 GHz. In the preferred embodiment, amplifier 100 operates around 30 GHz, which means the transistor cell increases beta or the gain from a little more than 4 to a little more than 8, which is a considerable increase in high-frequency amplification capability. It also increases the input impedance at the base due to the higher effective beta.

Transistor cells 102, 104, 106, and 108 can each be treated as a single transistor unit super-cell, and in that regard, transistor cells 106 and 108 each form the enhanced common-emitter first amplification stage of the cascode differential RF amplifier 100. Transistor cells 106 and 108 are connected to RF input ports 116 and 117 that receive a differential input signal (e.g., input ports 116 and 117 include separate lines for Vin+ and Vin− signals whose difference is represented as the input signal Vin). Transistor cells 106 and 108 raise the impedance at input ports 116 and 117, which extends the useable frequency of operation and the level of power saturation where acceptable input impedance is maintained for high-frequency operation, and significantly increases the maximum RF gain per amplification stage for a given transistor technology.

The differential output signal from transistor cells 106 and 108 is delivered to output ports 118 and 119, which are connected to the second, common-base, stage of the cascode amplifier 100. The second amplification stage includes common-base transistor cells 102 and 104, which provides a low-impedance interface to reduce voltage gain and the Miller Capacitance effect for transistor cells 106 and 108, which further extends operating gain and bandwidth. Furthermore, transistor cells 102 and 104 have lower input impedance over a larger frequency range than a typical BJT transistor, which lowers significantly the Miller Capacitance effect for transistor cells 106 and 108 and provide a much larger overall frequency capability for amplifier 100.

Cascode-coupling transistor cells 102 and 104 with transistor cells 106 and 108, respectively, increase the bandwidth, gain, and phase linearity as amplifier 100 is operating in compression at these substantially high frequencies relative to the transistor technologies capability. The improved overall phase linearity of amplifier 100, compared to a standard cascode amplifier, occurs from the higher-starting input impedance and gain. Transistor cells 106 and 108 have a significantly higher starting input impedances and gain than a single transistor, so they will maintain higher impedances while amplifier 100 is operating in compression and cause less phase distortion.

As amplifier 100 enters compression, the high gain and high input impedance of transistor cells 106 and 108 reduces and alters the parasitic capacitances. Compression also causes the impedance and parasitic capacitance in common-base transistor cells 102 and 104 to change. The bases of transistor cells 102 and 104 have low common mode impedance terminations, which minimizes their effective impedance change due to compression. The impedance at the collectors of transistor cells 102 and 104 is minimized by setting the output choke inductance of impedance networks 124 and 126, so they resonate slightly above the intended operating frequency with the small signal parasitic capacitance of transistor cells 102 and 104. This means, in connection with a phasor diagram with a real and an imaginary axis, output ports 120 and 122 appear slightly inductive at the desired output frequency for small signal conditions and swing through the real axis before entering the capacitive region. This maintains output ports 120 and 122 closer to real impedance for more compression range.

Additionally, some negative feedback adds linearity and RF gain and matching control for amplifier 100. A pair of capacitors 133 and 135 is connected in series between differential input ports 136 and 138, respectively, and transistor cells 106 and 108, respectively, to block DC currents.

A pair of impedance networks 124 and 126 is connected between output ports 120 and 122 of amplifier 100 and a power-supply voltage (Vcc). Another impedance network 127 is connected between transistor cells 106 and 108 and ground. Impedance network 127 is sized to have high impedance at operating frequencies to maintain good common mode rejection characteristics and maximizes voltage overhead by removing the DC component of the amplifier current with a DC short circuit.

Impedance networks 124, 126, 127 and 140 are reactive elements sized to resonate near the design frequency of operation for the amplifier, and can be a combination of resistors (R), inductors (L), or capacitors (C) sized and arranged in series or parallel depending on the design characteristics of amplifier 100. For example, impedance networks 124, 126, 127 and 140 can be configured as a parallel LC or RLC circuit.

A series-connected inductor 128 and a capacitor 132 are connected between output port 120 and an RF input port 136 of amplifier 100. A corresponding series-connected inductor 130 and a capacitor 134 are connected between output port 122 and an RF input port 138 of amplifier 100. Inductors 128 and 130 and capacitors 132 and 134 are sized to provide desired RF gain and impedance control with minimal impact to overall output power capability.

The operating range for amplifier 100 is maintained by providing a sufficient overhead voltage to the second amplification stage, the output stage of amplifier 100. This sufficient overhead voltage is supplied by a voltage source 142 to the common-base of transistors 102 and 104.

Figure 3:
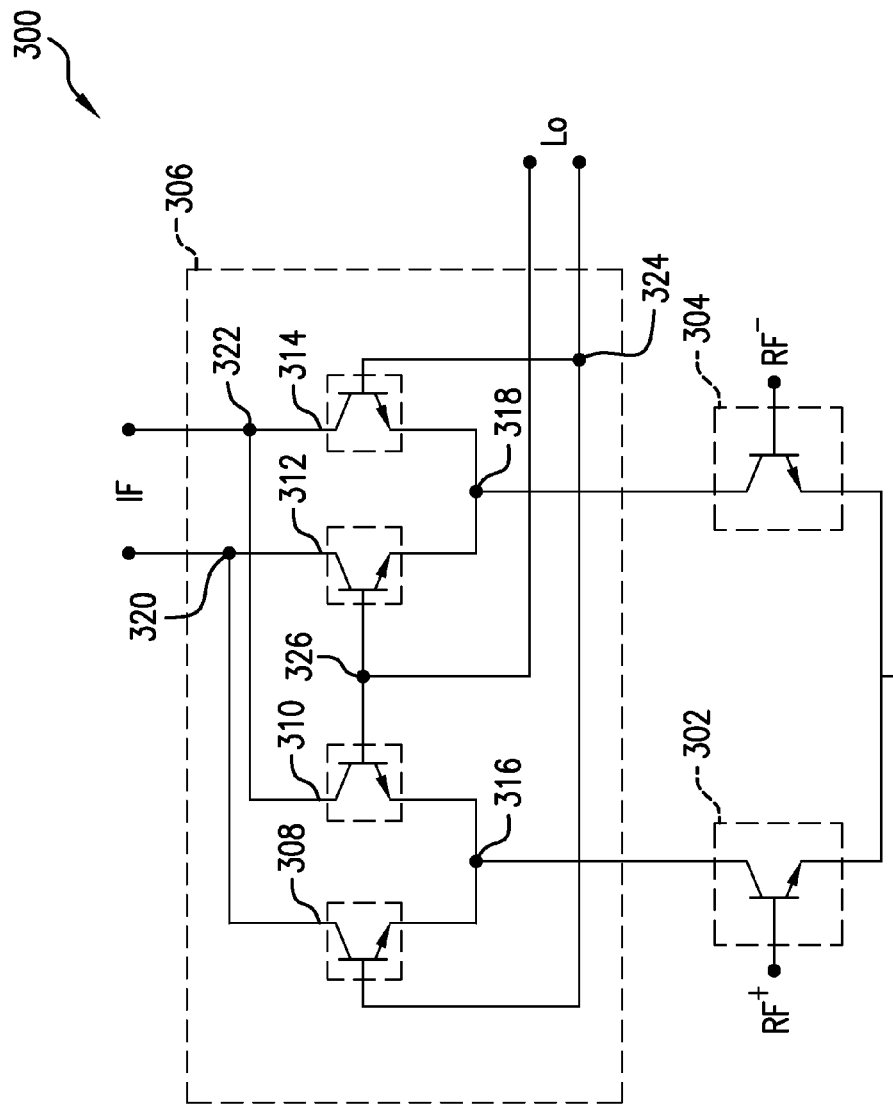
FIG. 3 is a schematic diagram of an RF mixer incorporating the cascode transistor cell pair of FIG. 1B and including two pairs of transistor cells.

Transistor cells are useful in many high-frequency RF applications where gain is required. FIG. 3 shows a mixer 300, for example, two transistor cells 302 and 304, each represented as a single transistor unit cell, connected to an RF mixer quad core 306. Mixers are often used for up-converting an intermediate frequency (IF) signal to a high-frequency signal or down-converting a high-frequency signal to an IF signal and can be used in both frequency conversion and frequency synthesis applications. Amplifier 100 can be modified for use in many types of mixers, such as unbalanced, single and double balanced mixers.

Transistor cells 302 and 304 form an amplification stage, and form a cascode with a cross-connected quad core 306, thereby creating an active double balanced mixer, i.e. a mixer with gain. Quad core 306 includes a transistor cell core with dual pairs of transistor cells 308-310 and 312-314. The emitter of dual transistor cell pairs 308-310 and 312-314 are connected at ports 316 and 318, respectively. The collectors of transistor cells 308 and 312 are connected at port 320, and the collectors of transistor cells 310 and 314 are connected at port 322. Ports 320 and 322 are the differential intermediate frequency output port. The bases of transistor cell 308 and 314 are connected at port 324, and the bases of transistor cell 310 and 312 are connected at port 326.

Quad core 306 configured as a mixer and functioning in a receiver, has a differential RF signal applied to the emitters of dual transistor cell pairs 308-310 and 312-314 that is provided by transistor cells 302 and 304. A differential local oscillator (LO) signal is applied to the bases of dual transistor cell pairs 308-310 and 312-314 at ports 324 and 326, respectively. A differential intermediate frequency (IF) mixed signal is provided by the collectors of dual transistor cell pairs 308-310 and 312-314, respectively, at ports 320 and 322, respectively.

Dual transistor cell pairs 308-310 and 312-314 function essentially as a common-base stage of a cascode amplifier, whereas transistor cells 302 and 304 function as the first, common-emitter stage.

Figure 4:
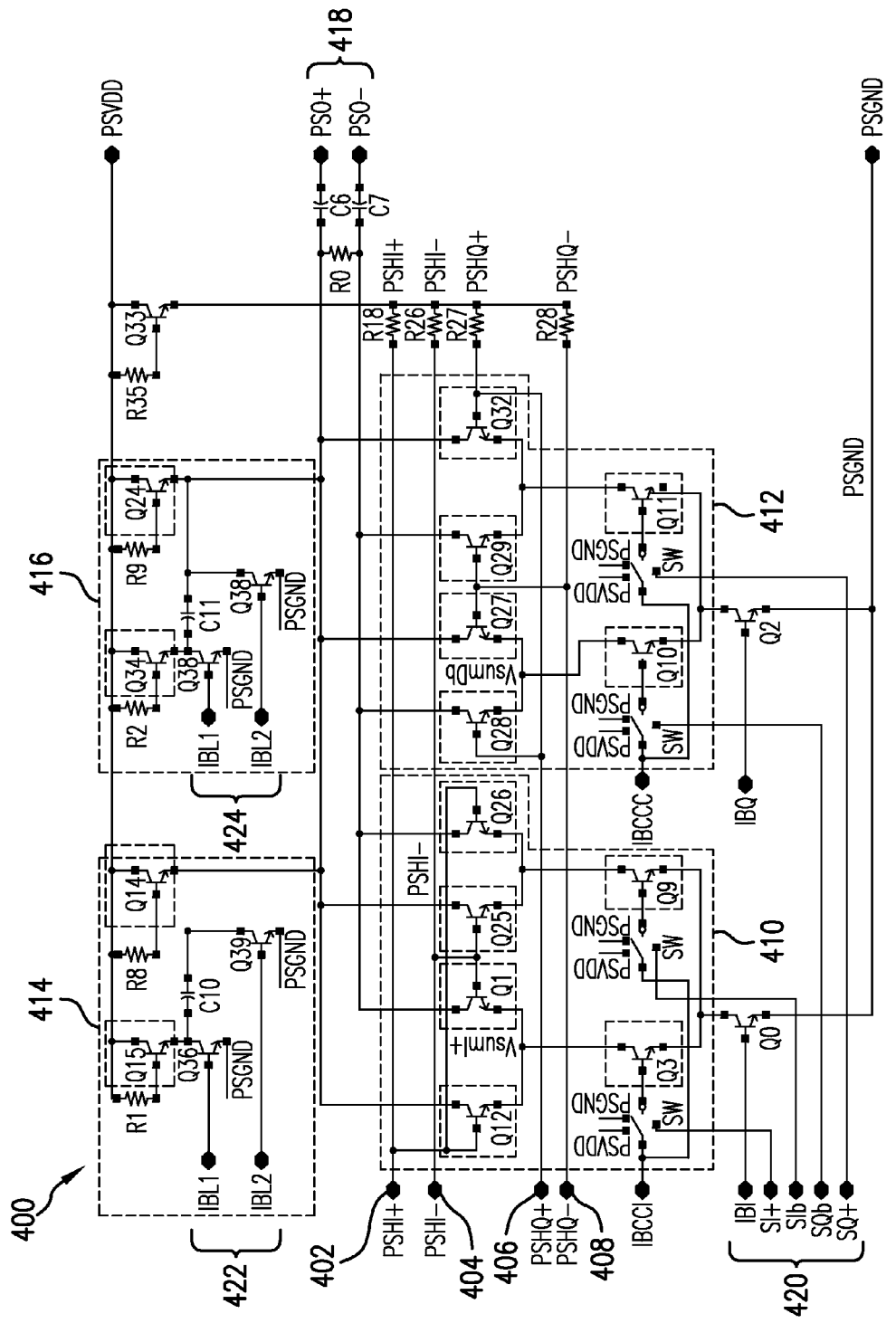
FIG. 4 is a schematic diagram of a phase shifter incorporating the transistor cell pair and the two pairs of transistor cells.

FIG. 4 is a schematic diagram of a differential adder 400 implementing transistor cell technology according to an embodiment of the present disclosure. According to various embodiments, differential adder 400 can be used within a vector phase shifter. Differential adder 400 is generally configured to receive components of an input signal (e.g., the input signal's I and Q components) and to output at output ports 418 a phase-shifted combination of the input signal's components. As shown, differential adder 400 can receive I-component signals (e.g., I+ and I– signals) at input ports 402, 404, respectively. Differential adder 400 can also receive Q-component signals (e.g., Q+ and Q– signals) at input ports 406, 408, respectively.

Differential adder 400 can include separate amplifiers 410 and 412. Amplifier 410 applies a gain to the I-component signals (e.g., I+ and I–) received at input ports 402, 404. Likewise, amplifier 412 applies a gain to the Q-component signals (e.g., Q+ and Q–) received at input ports 406, 408. In various embodiments, differential adder 400 uses amplifiers 410, 412 to apply different gains to the I and Q signal components received via input ports 402-408. Differential adder 400 can also include additional amplifiers, if the signal to be phase shifted is divided into further components (e.g., differential adder 400 can include four amplifiers to phase shift a signal divided into eight phase components). Amplifiers 410, 412 can include differential amplifiers (e.g., transistor cell pairs) constructed in parallel with cross-connected outputs to allow for four quadrant multiplication. For example, amplifiers 410, 412 include a transistor cell core with transistor cell pairs (e.g., {Q12, Q1}, {Q25, Q26}, etc., and shown as transistor super-cells) having common emitters. Another transistor cell (e.g. {Q3 and Q9}, and shown as a transistor super-cell) can also be connected to each common emitter junctions (e.g., the emitters of {Q12, Q1} can be connected to Q3, the emitters of {Q25, Q26} can be connected to Q9, etc.). Activation of either of the differential amplifiers in amplifiers 410, 412 can be achieved by activating corresponding switches, which control the bias routes in amplifiers 410, 412. For example, either of the differential amplifiers in amplifier 410 can be activated by toggling switches connected to transistor cell Q3 and Q9. Control of these switches can be used to regulate the sign of the amplified I or Q signals (e.g., either of the amplified I or Q signals can be phase shifted by 180° via control of the switches).

Differential adder 400 also includes amplifier loads 414 and 416 configured to provide variable gain control over the I and Q component signals by varying the input current to amplifiers 410, 412. Amplifier loads 414, 416 provide loads to the transistor cells of amplifiers 410, 412. The gain applied by amplifiers 410, 412 can be controlled to a high degree of precision by varying the amount of current across transistor cells Q1, Q12, Q25-Q29, and Q32 of amplifiers 410, 412. In one embodiment, amplifier load 414 can be a controllable load through input ports 422 for the differential amplifiers of amplifiers 410, 412 that amplify the I and Q signal components. For example, amplifier load 414 can act as a load on the collector of transistor cells Q12 or Q25 in amplifier 410, depending on which transistor cell is active at the time (e.g., by using input ports 420 to select activation of Q3 or Q9). Similarly, amplifier load 416 is controllable through input ports 424 and can act as a load on the collector of transistor cells Q27 or Q32, depending on which branch of amplifier 412 is active. In a similar manner, amplifier load 416 can act as a load on the collector of transistor cells Q1 or Q26 of amplifier 410 and transistor cells Q28 or Q29 of amplifier 412. Differential adder 400 is discussed in more detail in U.S. non-provisional patent application titled, "ULTRA-PRECISION LINEAR PHASE SHIFTER WITH GAIN CONTROL," Ser. No. 13/714,209, filed on Dec. 13, 2012, the contents of which are hereby incorporated by reference in its entirety.

Figure 5:
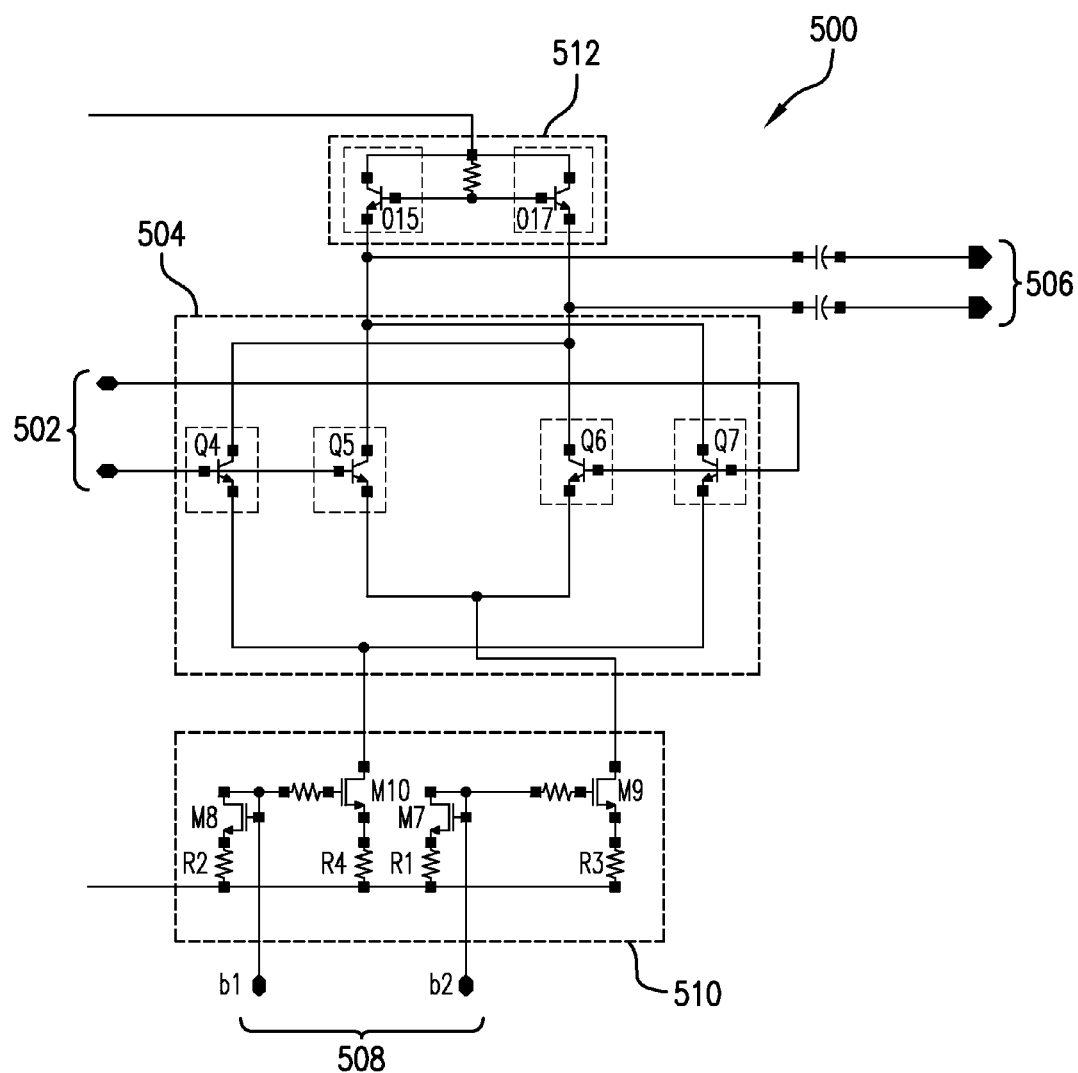
FIG. 5 is a schematic diagram of an amplitude controller incorporating transistor cells.

FIG. 5 shows an amplitude controller 500 implementing transistor cell technology according to an embodiment of the present disclosure. Amplitude controller 500 is a variable amplitude controller that allows for selectable control over the amount of attenuation or gain applied to an input signal (e.g., Vin) received at input ports 502. In some embodiments, amplitude controller 500 can be used to control the amplitude of a signal within an electronically scanned array (ESA). Amplitude controller 500 includes an amplifier 504 configured to apply a gain or attenuation to an input signal received via input ports 502. The amount of gain or attenuation applied by amplifier 504 is based on an active load 512 and the particular bias current supplied to amplifier 504 by a current mirror portion 510. Input ports 508 are control lines to control the amount of current from a DAC to the emitters of the transistors.

The input signal received at input ports 502 can be a differential signal. The input signal can be provided by input ports 502 to amplifier 504 of amplitude controller 500, which applies a gain or attenuation to the Vin+ and Vin– signals. The corresponding output signals from amplifier 504 and current mirror portion 510 are provided to output ports 506, which carries the amplitude-adjusted signals as a differential output signal (e.g., Vout).

The impedance of load 512 can be precisely controlled to produce a balanced impedance, which allows precise control over the transconductance of transistor cells Q15, Q17, shown as transistor super-cells. Small variations in the transconductance of transistor cells Q15, Q17 creates slight variations in the gain of amplifier 504 allowing for precise gain control of amplitude controller 500.

Amplifier 504 includes a transistor cell core with four transistor cells shown as transistor super-cells Q4-Q7 configured to adjust the amplitudes of the signals received at input ports 502. transistor cells Q4-Q7 in the transistor cell core can be cross-connected with one another to provide differential gains to the input signals. For example, the emitters of transistor cells Q4, Q7 can be connected and the emitters of Q5, Q6 can be connected, thereby forming two transistor cell pairs (e.g., a first pair, Q4, Q7 and a second pair Q5, Q6). In other words, each transistor cell in an amplification stage of amplifier 504 can be cross-connected with a corresponding transistor cell in another amplification stage of amplifier 504. Each of the input lines at input ports 502 can be connected to a different transistor cell's base within the transistor cell pairs (e.g., the Vin+ line is connected to the base of Q7 and the Vin− line is connected to the base of Q4). The collectors of a transistor cell pair can also be cross-connected with those of the other pair as part of the differential output lines of output ports 506. For example, the collectors of transistor cells Q4 and Q6 can be connected to form the Vout+ line of output ports 506 and the collectors of transistor cells Q5, Q7 can be connected to form the Vout− line of output ports 506. Amplitude controller 500 is discussed in more detail in U.S. non-provisional patent application titled, High Dynamic Range Precision Variable Amplitude Controller, Ser. No. 13/737,777, filed on Jan. 9, 2013, the contents of which are hereby incorporated by reference herein.

Incorporating transistor cells in the manners described above to improve phase linearity and enhancing the frequency range of operation is counter-intuitive. Increasing the ports (i.e. junctions between components) in an amplifier or mixer topology decreases the linear performance of the circuit when the circuit is operating at frequencies substantially lower than where the parasitic capacitances begin limiting the operation of the device. A typical cascode-connected amplifier has twice the junctions of a single transistor amplifier; however, the cascode-connected amplifier, at high frequencies, has better linearity than the single transistor amplifier. The super-cell transistor cell in a cascode configuration similarly has better linearity in high-frequency operations.

Various implementations of the disclosed embodiments can be incorporated into a portable communications device such as an RF transmitter-receiver of a mobile device, a personal communications service (PCS) phone, a wireless local area network (LAN) transmitter-receiver, etc.

While the present invention has been particularly shown and described with reference to exemplary embodiments thereof, it should be understood by those of ordinary skill in the art that various changes, substitutions and alterations could be made herein without departing from the scope of the invention as defined by appended claims and their equivalents.

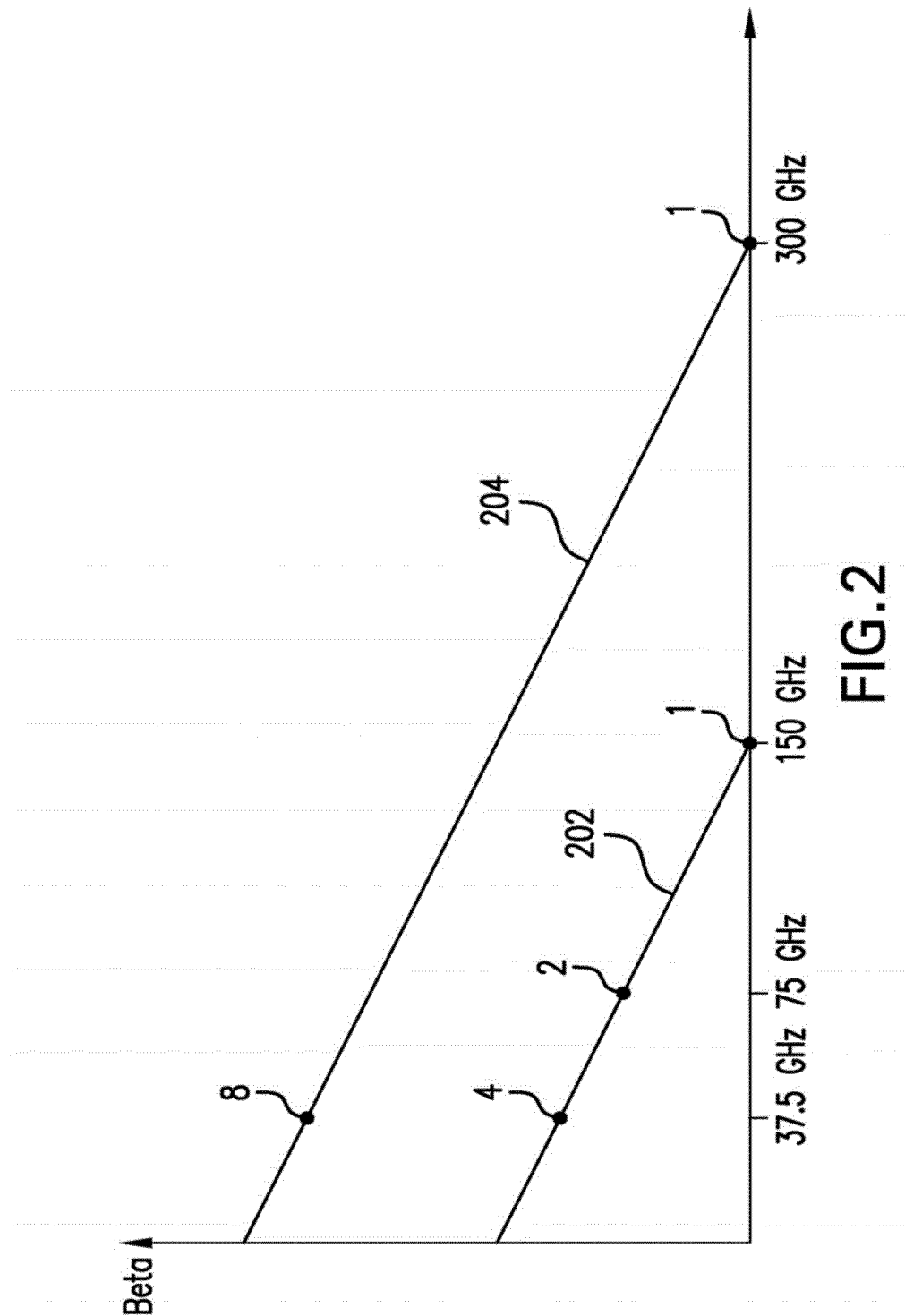

What is claimed is:

1. A circuit comprising:
 a first transistor cell having a collector, a base, and an emitter, wherein the first transistor cell is a first amplification stage, and the first transistor cell further comprises a first transistor including an emitter, a base, and a collector, a second transistor including an emitter, a base, and a collector, and a third transistor including an emitter, a base, and a collector, wherein the collector of the first transistor is connected to the collector of the second transistor and the emitter of the first transistor is connected to the base of the second transistor, and wherein the collector of the third transistor is connected to the base of the second transistor, the base of the third transistor is connected to the base of the second transistor, and the emitter of the second transistor is connected to the emitter of the third transistor; and
 wherein a current at the collector of the first transistor cell produces a minimum transconductance in the first transistor cell that increases a current gain of the first transistor cell and improves at least one operating characteristic of the first transistor cell;
 a second transistor cell having a collector and a base, wherein the emitter of the first transistor cell is connected to the collector of the second transistor cell, wherein the second transistor cell further comprises a first transistor, a second transistor and a third transistor.

2. The circuit of claim 1, wherein the at least one operating characteristic is one chosen from a bandwidth, a gain, and an output power.

3. The circuit of claim 2, wherein the minimum transconductance is at least 0.77 Siemens.

4. The circuit of claim 1, wherein the minimum transconductance is 1 Siemens or greater than 1 Siemens.

5. The circuit of claim 4, wherein the minimum transconductance causes a squaring effect of a current gain to improve the at least one operating characteristic of the first transistor cell.

6. The circuit of claim 1, wherein the current at the collector of the first transistor cell is at least 20 milliamps.

7. The circuit of claim 1, and further comprising an input port connected to the base of the second transistor cell; and an output port connected to the collector of the first transistor cell or the emitter of the first transistor cell.

8. The circuit of claim 7, wherein the first transistor cell and the second transistor cell are biased forward active.

9. The circuit of claim 1, wherein the collector of the second transistor cell is connected to an output port, and further comprising an impedance network connected between the output port and a power supply voltage.

10. The circuit of claim 9, wherein the base of the first transistor cell is connected to an input port, and further comprising a second impedance network connected to the input port.

11. The circuit of claim 10, and further comprising a third impedance network connected between the input port and the output port.

* * * * *

UNITED STATES PATENT AND TRADEMARK OFFICE
CERTIFICATE OF CORRECTION

| | | |
|---|---|---|
| PATENT NO. | : 9,444,418 B1 | |
| APPLICATION NO. | : 14/206632 | |
| DATED | : September 13, 2016 | |
| INVENTOR(S) | : Russell D. Wyse et al. | |

It is certified that error appears in the above-identified patent and that said Letters Patent is hereby corrected as shown below:

On the Title Page

Delete title page and substitute therefore with the attached title page showing corrected number of Drawing Sheets.

In the Drawings

Figure 1A:
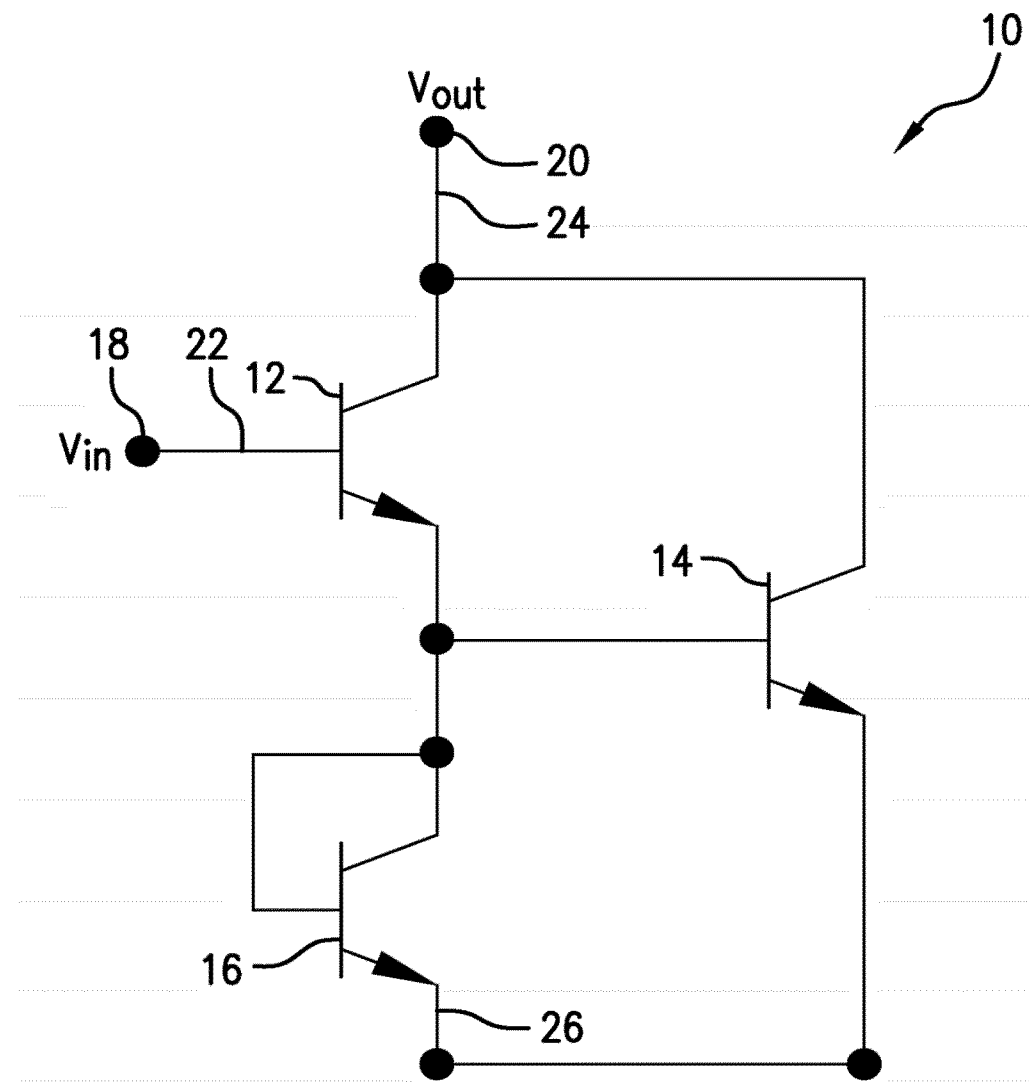
Figure 1D:
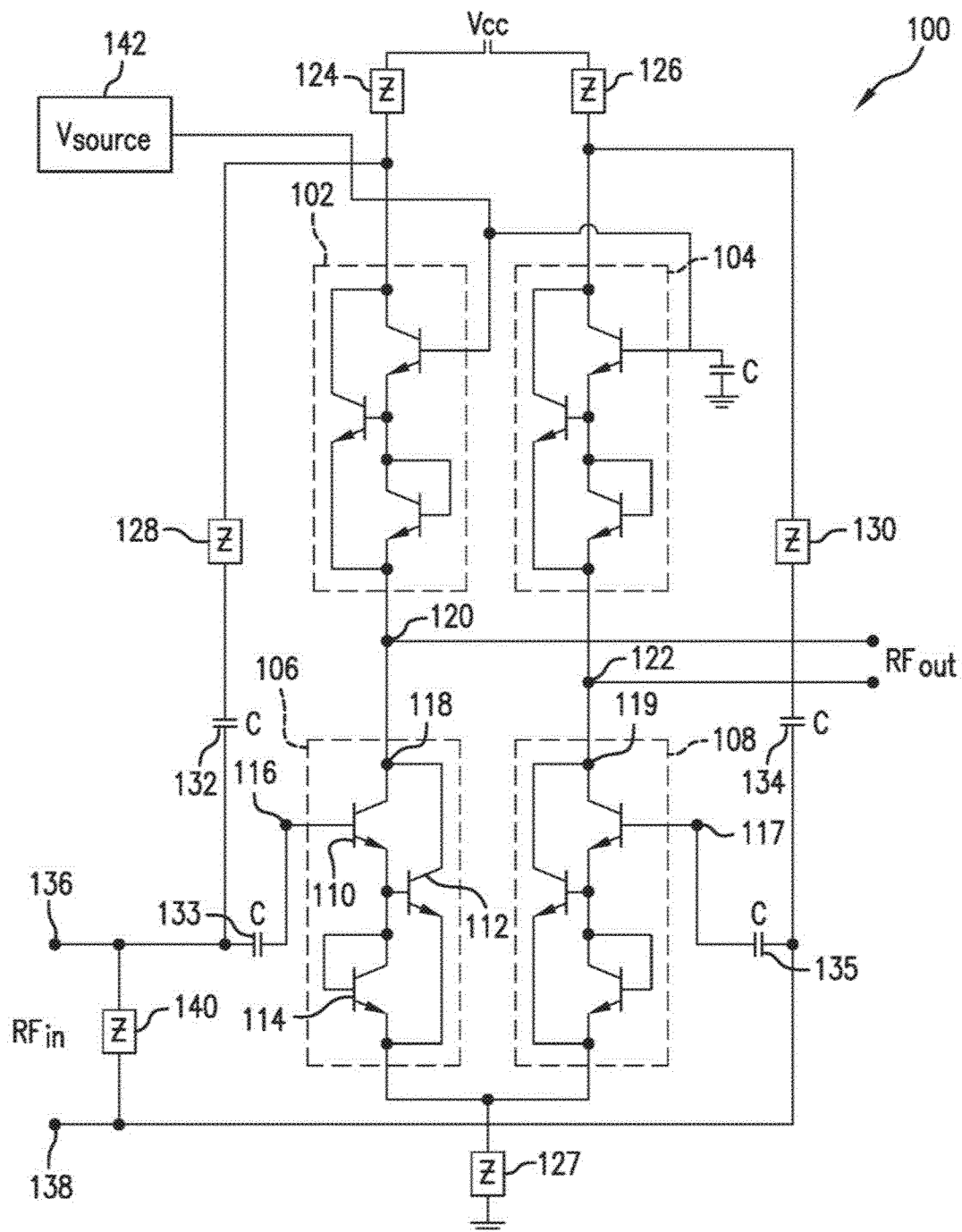
FIG. 1B is a schematic diagram of a cascode transistor cell pair.
FIG. 1C is symbol of a bipolar junction transistor found in the Transistor cell of FIG. 1A.
Figure 3:
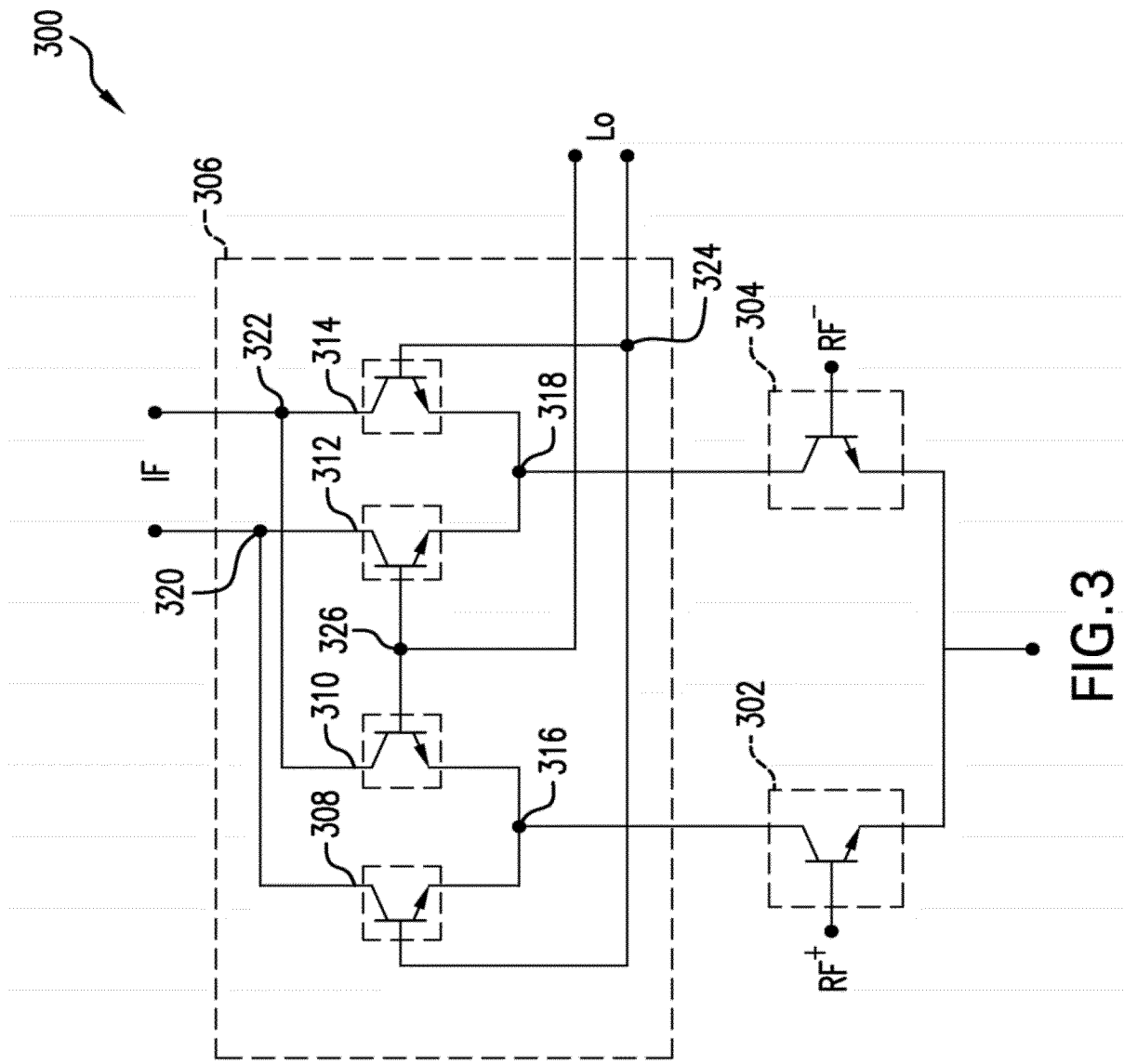
Figure 4:
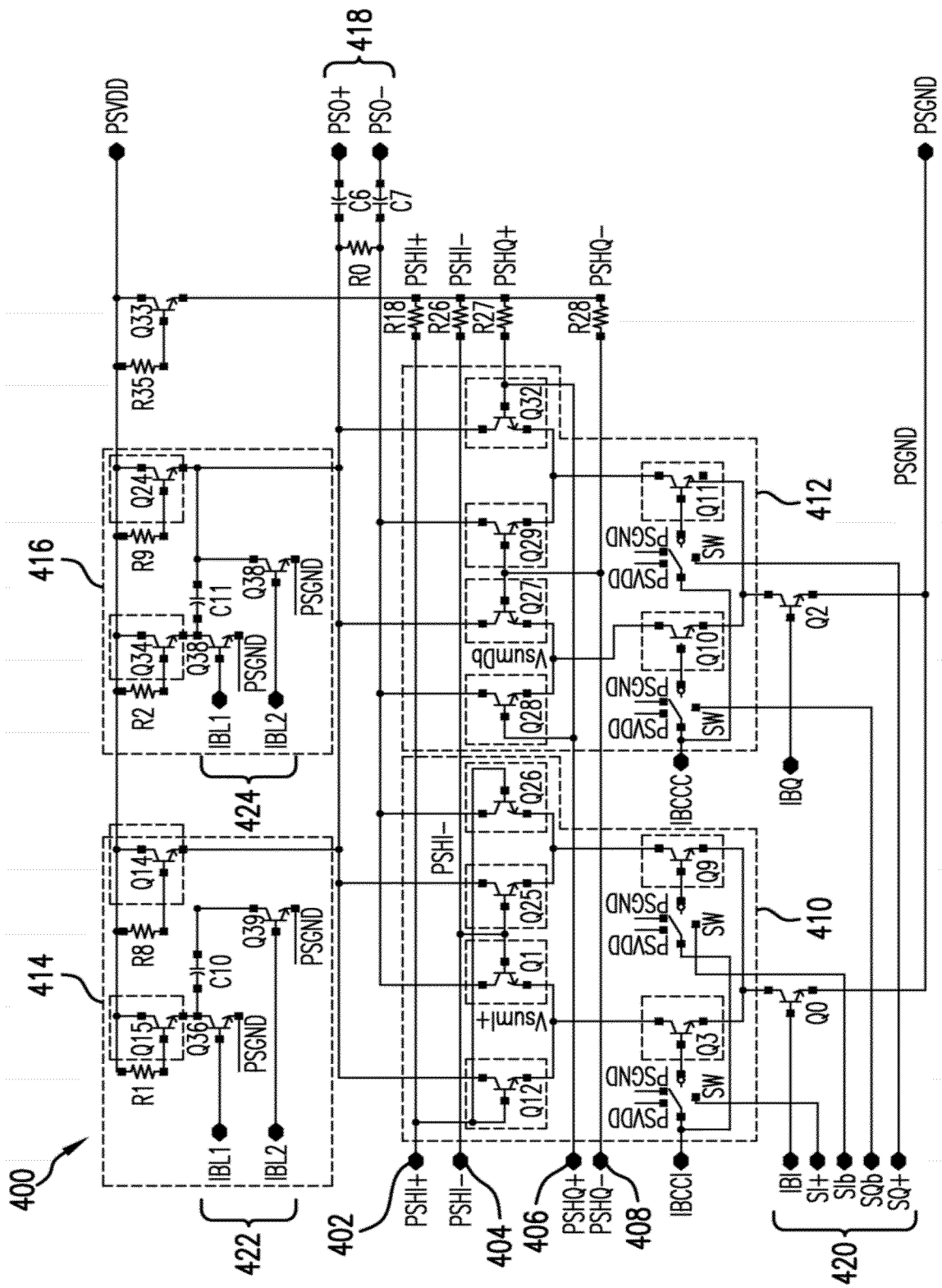
Figure 5:
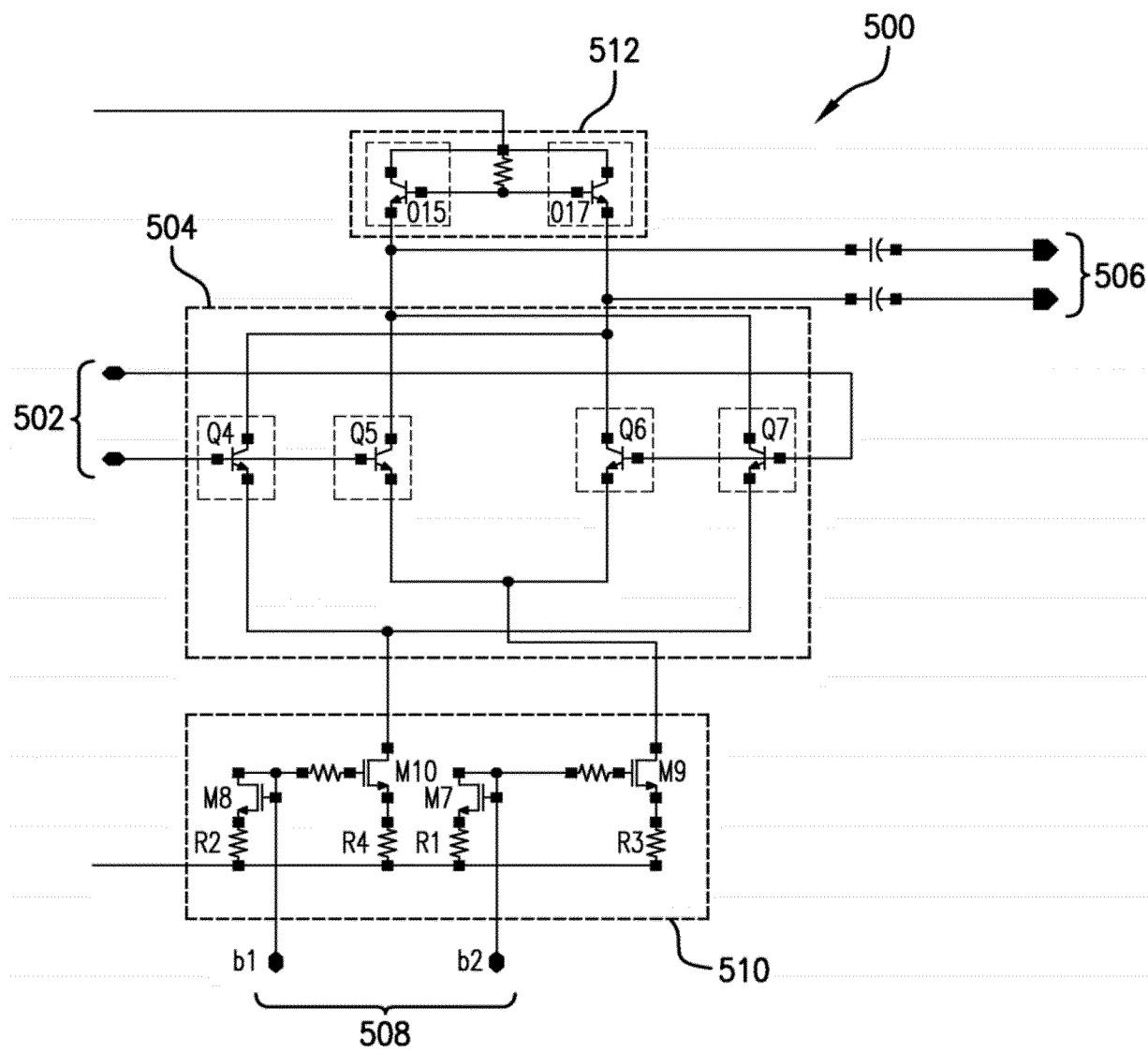
Figure 6A:
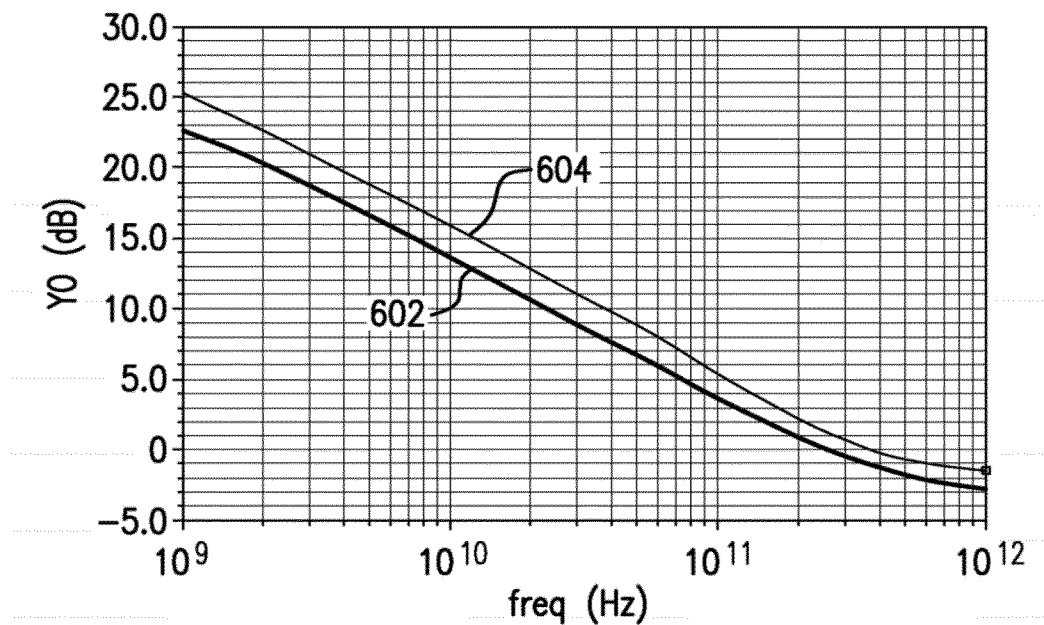
Figure 6B:
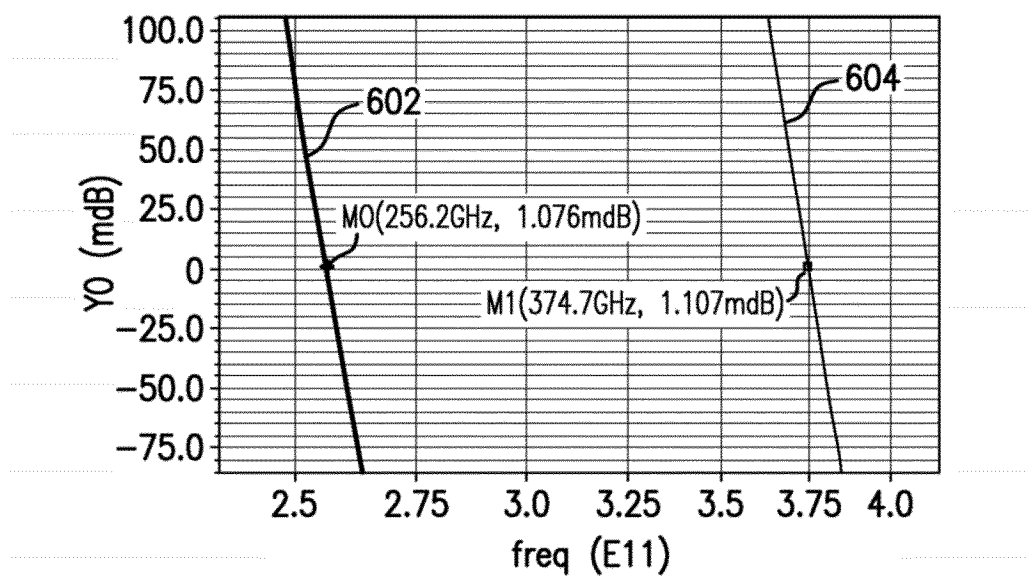

Delete Drawing Sheets 1-7 and substitute therefore with the attached Drawing Sheets 1-8. FIG 1D has been added.

In the Specification

Column 3, add new paragraph before Line 1:
FIG. 1D is a schematic diagram of an alternative embodiment of a cascode transistor cell pair.

Add the following sentence to the end of the paragraph that ends at Column 6, Line 34:
Alternatively, as shown in FIG. 1D, the RF output port can be connected to the emitter of the transistor cells 102, 104.

Signed and Sealed this
Twenty-fifth Day of September, 2018

Andrei Iancu
*Director of the United States Patent and Trademark Office*

(12) United States Patent
Wyse et al.

(10) Patent No.: US 9,444,418 B1
(45) Date of Patent: Sep. 13, 2016

(54) FREQUENCY ENHANCED ACTIVE TRANSISTOR

(71) Applicants: Russell D. Wyse, Center Point, IA (US); Michael L. Hageman, Mt. Vernon, IA (US)

(72) Inventors: Russell D. Wyse, Center Point, IA (US); Michael L. Hageman, Mt. Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 41 days.

(21) Appl. No.: 14/206,632

(22) Filed: Mar. 12, 2014

Related U.S. Application Data

(60) Provisional application No. 61/789,902, filed on Mar. 15, 2013.

(51) Int. Cl.
*H03F 3/45* (2006.01)
*H03F 3/19* (2006.01)
*H03G 3/00* (2006.01)

(52) U.S. Cl.
CPC ............. *H03F 3/4508* (2013.01); *H03F 3/19* (2013.01); *H03G 3/00* (2013.01)

(58) Field of Classification Search
CPC .................................................. H03F 3/45076
USPC ........................................ 330/252, 254, 288
See application file for complete search history.

(56) References Cited

U.S. PATENT DOCUMENTS 4,236,119 A * 11/1980 Battjes .................... H03F 1/42
330/288
5,399,988 A   3/1995 Knierim

* cited by examiner

*Primary Examiner* — Khanh V Nguyen
*Assistant Examiner* — Khiem Nguyen
(74) *Attorney, Agent, or Firm* — Donna P. Suchy; Angel N. Gerdzhikov

(57) ABSTRACT

A transistor cell can be modeled as a transistor with a collector, a base, and an emitter operating with a current at the collector to produce a minimum transconductance in the transistor cell that increases a current gain and improves at least one operating characteristic of the transistor cell. The operating characteristics include bandwidth, gain, and output power.

11 Claims, 8 Drawing Sheets

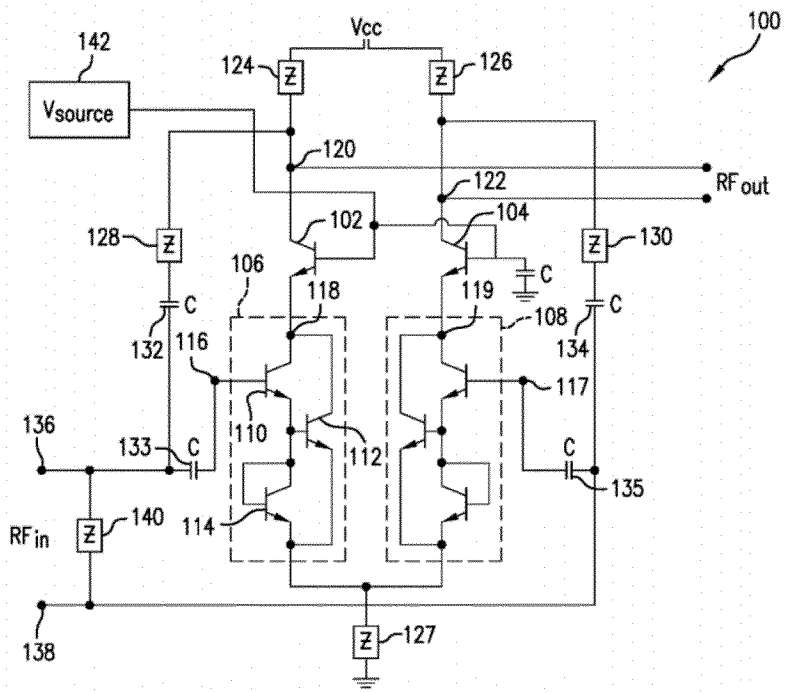

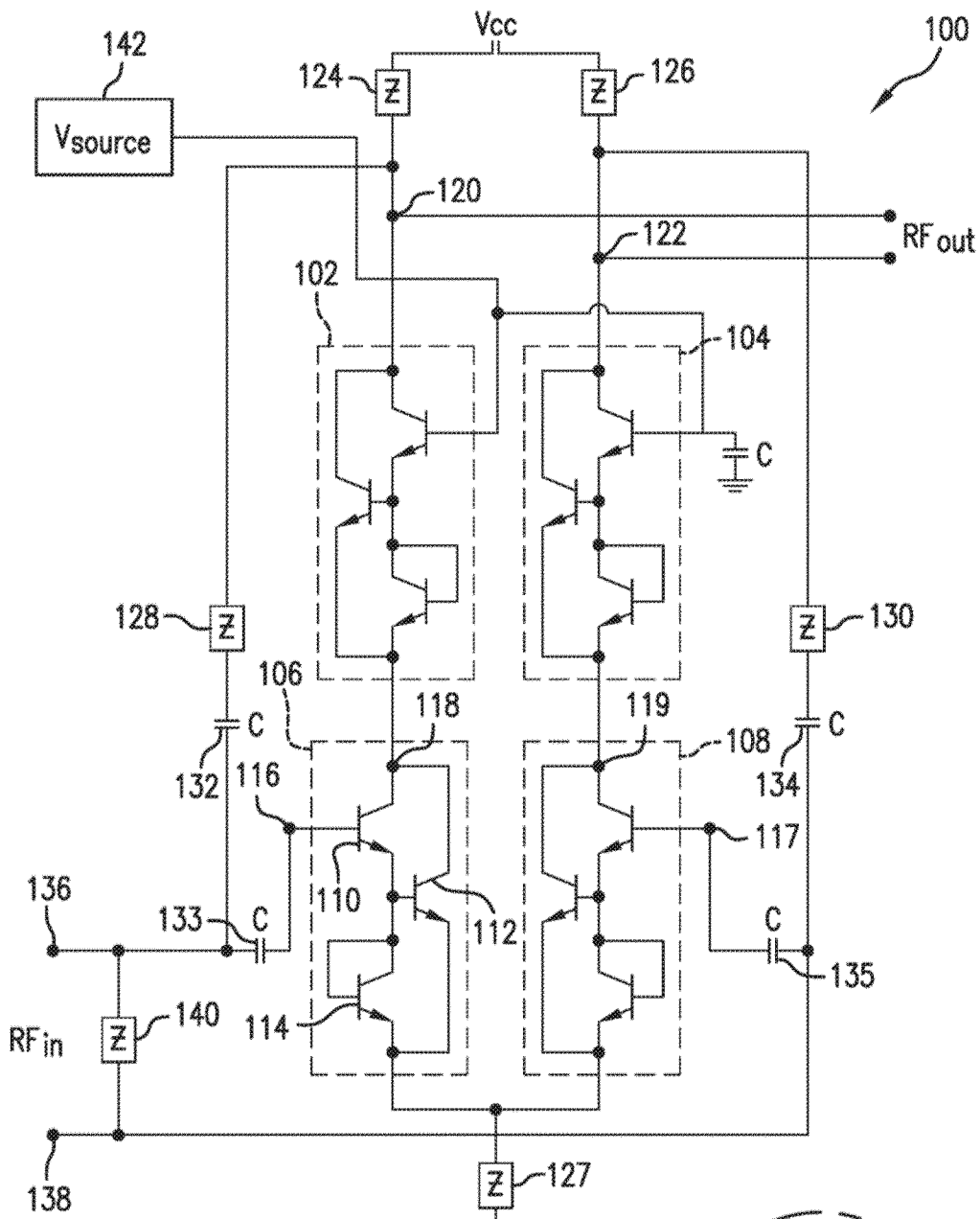
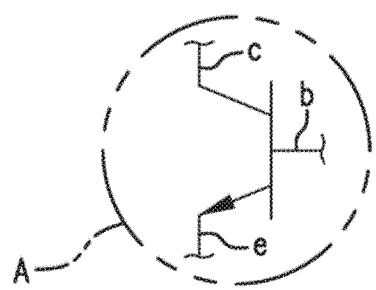
FIG.1B
FIG.1C